United States Patent [19]
Omori et al.

[11] Patent Number: 6,097,440
[45] Date of Patent: *Aug. 1, 2000

[54] SYNCHRONOUS PROCESSING DEVICE

[75] Inventors: Masayuki Omori, Tokyo; Kiyohiro Oka, Kanagawa, both of Japan

[73] Assignee: Sony Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/744,643

[22] Filed: Nov. 6, 1996

[30] Foreign Application Priority Data

Nov. 17, 1995 [JP] Japan ................................ 7-300059

[51] Int. Cl.[7] ................................................ H03L 7/00
[52] U.S. Cl. .......................... 348/542; 348/536; 348/530; 348/540
[58] Field of Search ................................ 348/542, 533, 348/540, 536, 521, 530, 546, 541

[56] References Cited

U.S. PATENT DOCUMENTS

| | | | |
|---|---|---|---|
| 4,047,223 | 9/1977 | Hofmann | 348/542 |
| 4,122,488 | 10/1978 | Mikado | 348/523 |
| 4,203,076 | 5/1980 | Yamashita | 331/20 |
| 4,287,529 | 9/1981 | Tatami et al. | 386/51 |
| 4,496,978 | 1/1985 | Sakamoto et al. | 348/533 |
| 4,634,939 | 1/1987 | Dietz | 315/399 |
| 4,686,560 | 8/1987 | Balaban et al. | 348/508 |
| 4,812,783 | 3/1989 | Honjo et al. | 331/20 |
| 4,860,090 | 8/1989 | Murata et al. | 348/604 |
| 4,922,343 | 5/1990 | Ando | 348/558 |
| 4,996,596 | 2/1991 | Hirao et al. | 348/542 |
| 5,021,719 | 6/1991 | Arai et al. | 315/364 |
| 5,025,310 | 6/1991 | Sekiya et al. | 348/506 |
| 5,126,639 | 6/1992 | Srivastava | 315/364 |
| 5,142,204 | 8/1992 | Gornati et al. | 315/364 |
| 5,153,725 | 10/1992 | Masaike | 348/544 |
| 5,168,246 | 12/1992 | Pulluru et al. | 331/8 |
| 5,331,347 | 7/1994 | Wu | 348/536 |
| 5,359,265 | 10/1994 | Kii et al. | 315/367 |
| 5,404,172 | 4/1995 | Berman et al. | 348/465 |
| 5,486,866 | 1/1996 | Helfrich et al. | 348/500 |
| 5,614,870 | 3/1997 | Sauer et al. | 331/14 |
| 5,621,485 | 4/1997 | Terao et al. | 348/735 |
| 5,631,708 | 5/1997 | Nakagaki | 348/500 |

*Primary Examiner*—John K. Peng
*Assistant Examiner*—Linus M. Lo
*Attorney, Agent, or Firm*—Frommer, Lawrence & Haug, LLP.; William S. Frommer; Dexter T. Chang

[57] ABSTRACT

A synchronous control device is disclosed which is capable of obtaining stable synchronization regardless of the kind of image source even when the automatic synchronous control circuit cannot operate in the normal manner.

The device includes a phase comparator, an integrator, a horizontal oscillation circuit, and a horizontal synchronous control circuit composed of a frequency measuring section consisting of a digital frequency measuring circuit, etc. and a control section consisting of a frequency determining circuit, an oscillation frequency control circuit, etc. The frequency measuring section measures the input horizontal synchronizing frequency and transfers it to the control section as digital data, and the control section determines the true value of the input synchronizing frequency by the frequency determining circuit while monitoring the transition of the frequency data per unit time. The oscillation frequency control circuit performs control to adapt the oscillation frequency of the horizontal oscillation circuit to the determined true value, whereby a highly accurate synchronous control is possible.

10 Claims, 8 Drawing Sheets

SYNCHRONOUS PROCESSING DEVICE

BACKGROUND OF THE INVENTION

1. Field of the Invention

The present invention relates to a synchronous processing device in a multi-scan display device compatible with a plurality of horizontal and vertical synchronizing frequencies, such as a monitor or projector device.

2. Description of the Related Art

As a result of the recent remarkable progress in telecommunication techniques, a variety of new media of radio and wired types are coming along. A high-definition television receiver with high image quality having an aspect ratio of 16:9 and a wide television receiver of an aspect ratio of 16:9 (EDTV-II) have become widespread.

On the other hand, as information apparatuses such as computers get into widespread use, graphics images, moving pictures and character information of CD-ROM, internet, etc. have come to be displayed for use on television receivers.

As is well known in the art, such image signal sources have various horizontal and vertical synchronizing frequencies (for example, horizontal frequencies of 15~135 KHZ). For such image signal sources, a multi-scan display device compatible with a plurality of horizontal and vertical synchronizing frequencies are used. In a multi-signal into voltage, a vertical oscillation circuit 6, etc.

Figure 6A:
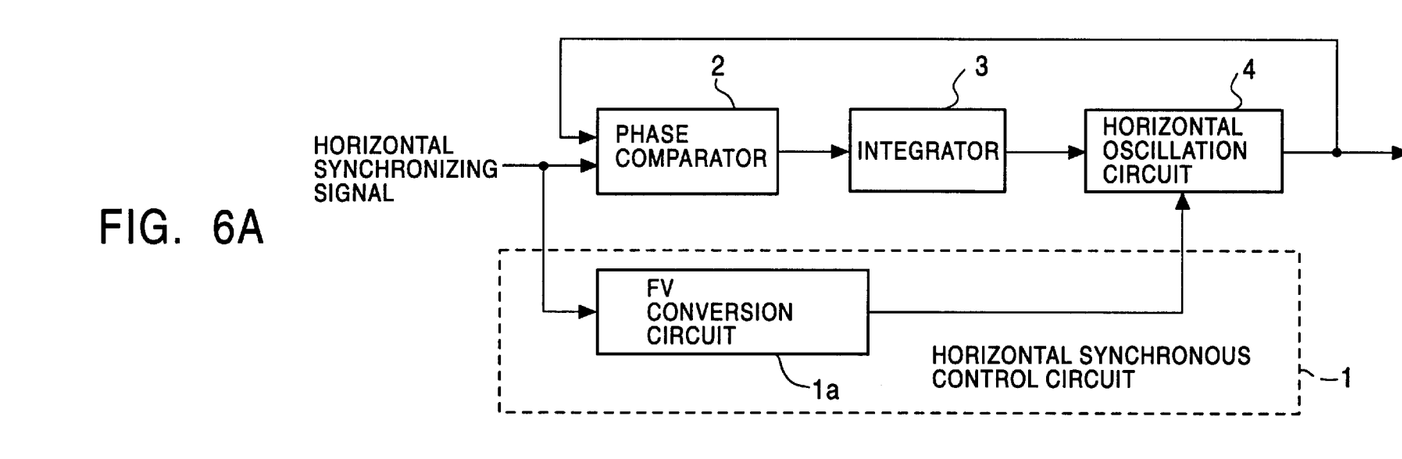
FIG. 6A is a block diagram showing a horizontal synchronous processing device.

The operation of the horizontal synchronous processing device of FIG. 6A will be described. An input horizontal synchronizing signal is supplied in parallel to the phase comparator 2 and the FV conversion circuit 1a. The phase comparator 2 performs phase comparison of the input horizontal synchronizing signal with the signal fed back from the horizontal oscillation circuit 4 controlled by the FV conversion circuit 1a. This comparison output is integrated by the integrator 3, and supplied to the horizontal oscillation circuit 4 on the output side as a control signal. The horizontal oscillation circuit 4 is connected to the above-mentioned FV conversion circuit 1a and is supplied with a frequency control voltage from the FV conversion circuit 1a, whereby the freerunning frequency of the horizontal oscillation circuit 4 is controlled.

Figure 6B:
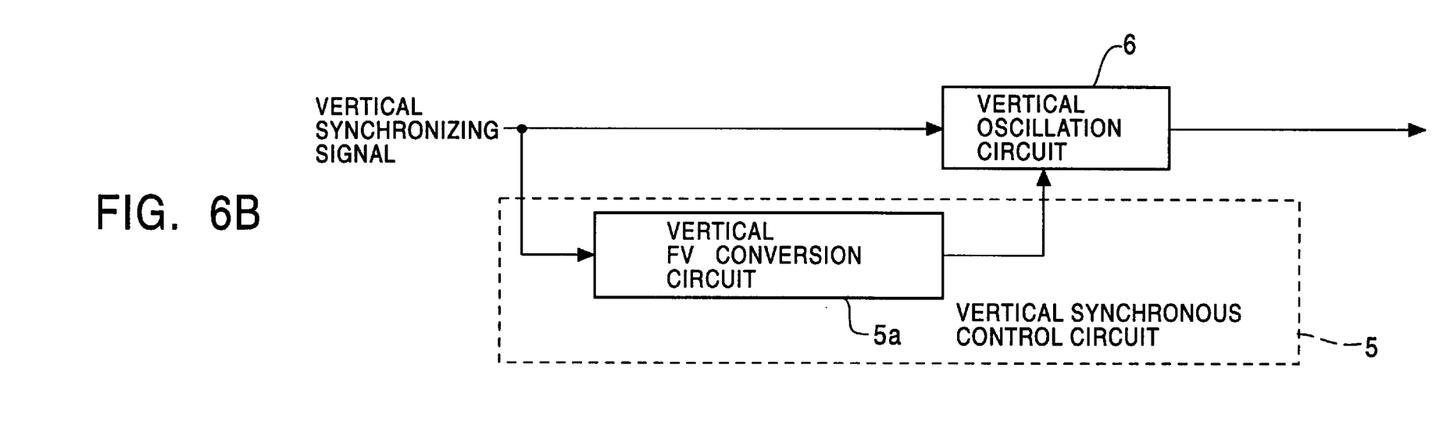
FIG. 6B is a block diagram showing a vertical synchronous processing device.

In the vertical synchronous processing device of FIG. 6B, an input vertical synchronous signal frequency is supplied to the vertical FV conversion circuit 5a, and a predetermined control voltage is supplied to the vertical oscillation circuit 6, whereby the freerunning frequency of the vertical oscillation circuit 6 is controlled.

Here, the principle of the FV conversion circuit will be described. The FV conversion circuit obtains a voltage integral after shaping an input signal pulse into a pulse of a fixed width by a monostable multivibrator (not shown) or the like, and in principle has characteristics faithfully proportional to the input frequency. Thus, when the oscillation frequency of the horizontal and vertical oscillation circuits have characteristics proportional to the control voltage, it is possible to cause the oscillation frequency to respond to the input synchronizing frequency in a satisfactory manner by this construction. However, an automatic synchronous control circuit using such an FV conversion circuit has potentially a problem in that the control becomes unstable depending upon the noise components contained in the input signal. That is, in a standard television signal source (such as NTSC or PAL) for television broadcasting, VTR, etc., there is a possibility that noises are contained in the signal source since radio waves, video tapes, etc. are used. In the case of such a signal source, a stable synchronous output cannot be obtained by the automatic synchronous control circuit as described above. In view of this, in conventional synchronous processing devices, an automatic synchronous control circuit such as an FV conversion circuit is not used when reproducing a standard television signal; instead, the control voltage to be supplied to the oscillator is switched to a fixed voltage for television signals. Next, a synchronous control device in which such measures are taken will be described.

Figure 7:
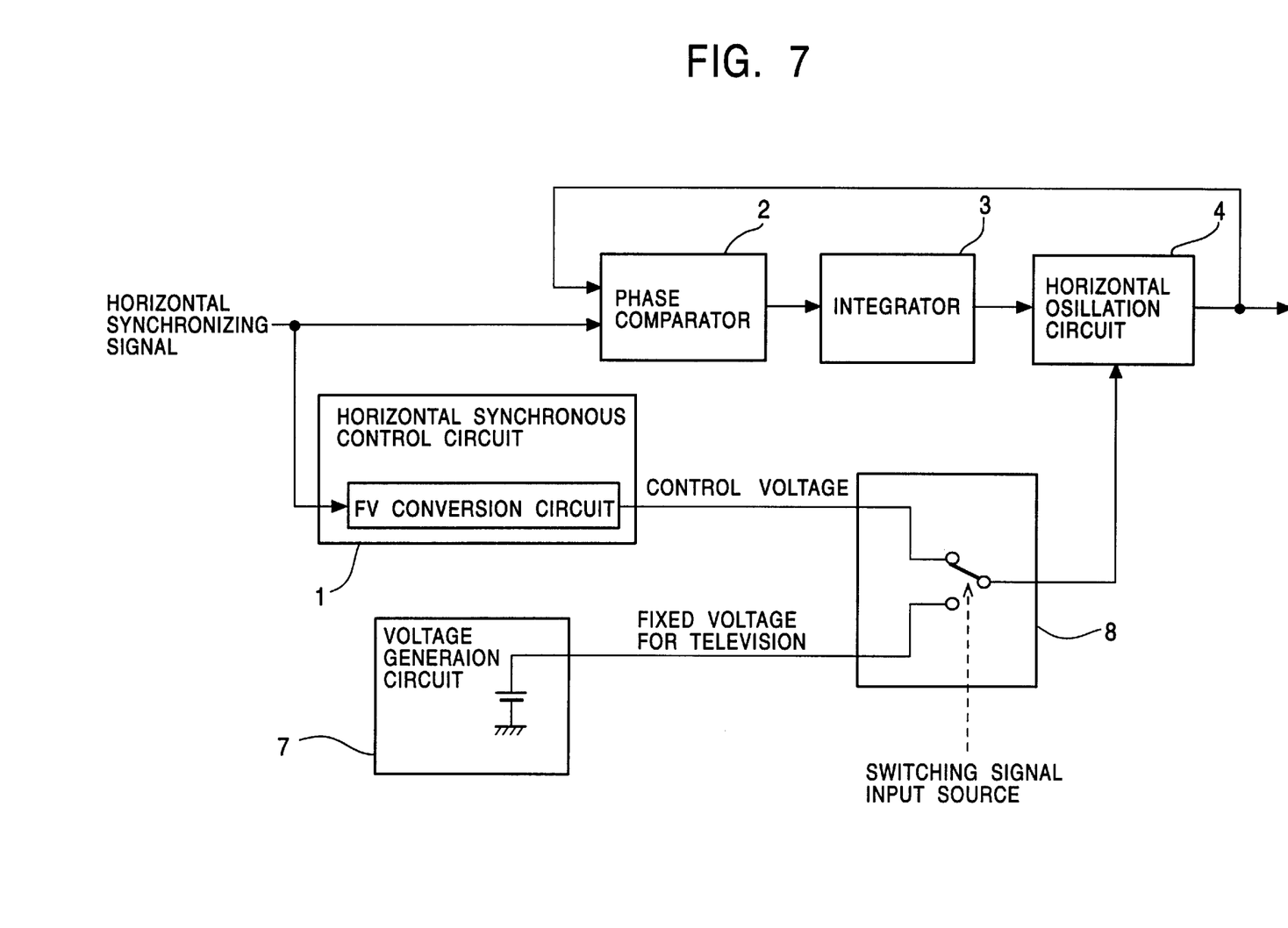
FIG. 7 is a diagram showing a second example of a conventional synchronous processing device.

The construction of a second example of the conventional synchronous processing device will be described with reference to FIG. 7. FIG. 7 is a block diagram showing a second example of the conventional synchronous processing device.

In addition to the horizontal synchronous control circuit 1, the phase comparator 2, the integrator 3 and the horizontal oscillation circuit 4, which are components of the first example of the conventional device, the device shown in FIG. 7 further comprises a voltage generation circuit 7 for generating a fixed voltage for television, a switching device 8 for selectively switching the output of the horizontal synchronous control circuit 1 and that of the voltage generation circuit 7 in response to an input source switching signal, etc.

When reproducing a standard television signal source such as television broadcasting or VTR, switching is effected by the switching device 8 to the fixed voltage for television generated in the voltage generation circuit 7. In the case of a non-standard television signal source (e.g., a graphics image signal of a computer or the like or a high-definition television signal), the control voltage generated by the above-mentioned horizontal synchronous circuit 1 is supplied. In this way, the control voltage supplied to the horizontal oscillation circuit 4 is selected by the switching device 8, so that, when reproducing a standard television signal source, the control voltage supplied to the horizontal oscillation circuit 4 is fixed to an optimum value for television, and there is no fear of the synchronous control becoming unstable due to the influence of noises, etc.

Figure 8:
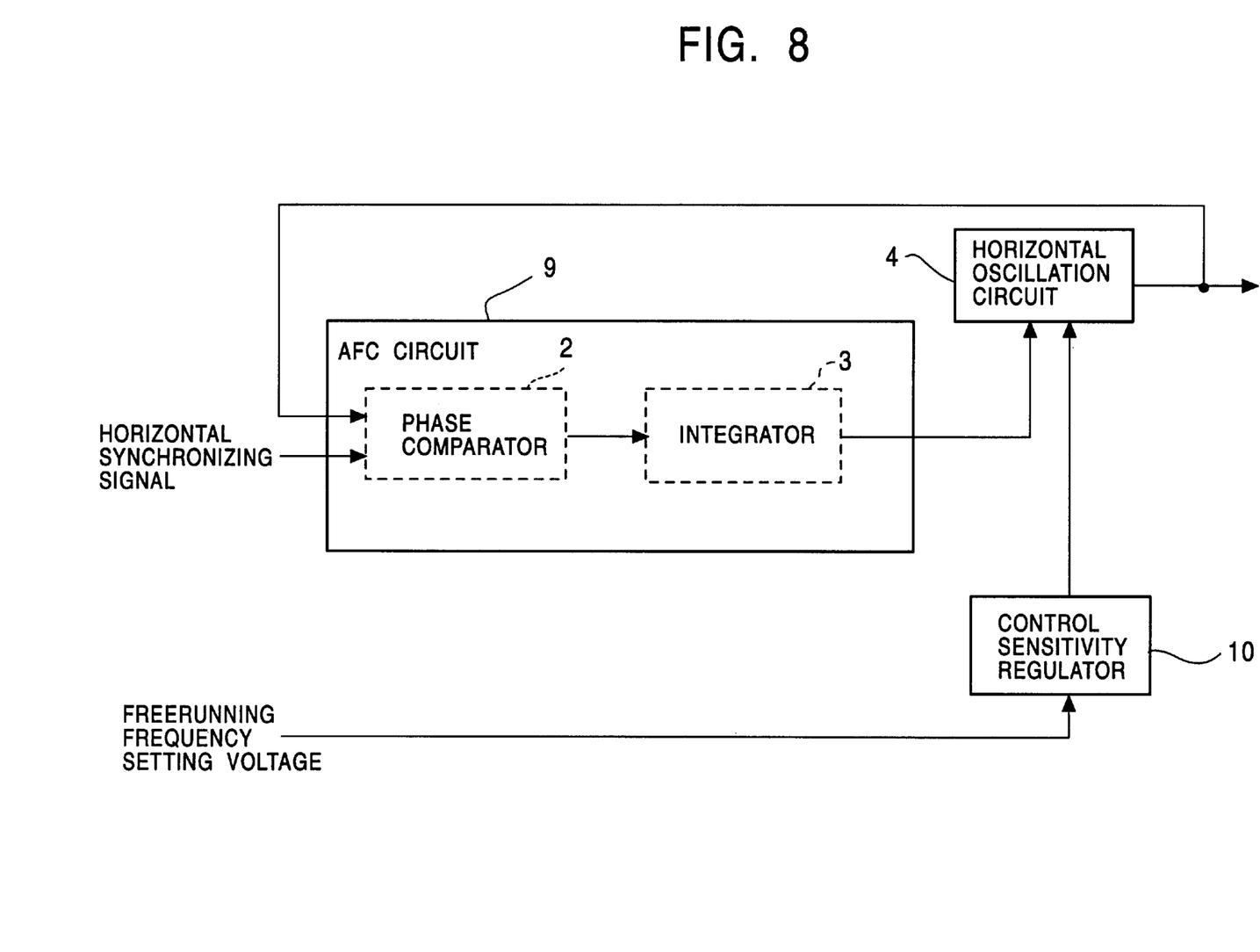
FIG. 8 is a diagram showing a third example of a conventional synchronous processing device.

Further, in conventional synchronous processing devices, a method is sometimes used in which the oscillation circuit is controlled by an AFC circuit similar to a television receiver. However, the frequency drawing width due to the AFC circuit is only several % or so, so that it is impossible to cover the synchronizing frequency range, which is several times as large as that. In view of this, separately from the AFC circuit, it is necessary to control the freerunning frequency itself of the horizontal oscillation circuit such that it substantially coincides with the horizontal synchronizing frequency. Such a method will be described with reference to FIG. 8. FIG. 8 is a block diagram showing a third example of the conventional synchronous processing device.

The third example of the conventional synchronous processing device shown in FIG. 8 is composed of an AFC circuit 9, a control sensitivity regulator 10, etc., the AFC circuit 9 being composed of a phase comparator 2, an integrator 3, etc.

An input horizontal synchronizing signal is input to the AFC circuit 9, and a freerunning frequency setting voltage is input to the control sensitivity regulator 10. Here, the freerunning frequency setting voltage is obtained, for example, from the output of the FV conversion circuit 1a shown in FIG. 6. The AFC circuit 9 performs phase comparison of the input horizontal synchronizing signal and the synchronizing frequency fed back from the horizontal oscillation circuit, and controls the horizontal oscillation circuit 4 in accordance with this comparison output. The control sensitivity regulator 10 performs control sensitivity regulation such that coincidence is achieved in the relationship between the absolute value of the oscillation frequency of the horizontal oscillation circuit 4 and the freerunning frequency setting voltage. That is, it is difficult to construct the horizontal oscillation circuit 4 such that oscillation is effected in proportion to the freerunning frequency setting voltage, and, by providing the control sensitivity regulator 10, the horizontal oscillation circuit 4 is caused to perform oscillating operation in proportion to the freerunning frequency setting voltage. In this way, a control voltage proportional to the input synchronizing frequency obtained through generation of a horizontal synchronizing signal by the FV conversion circuit or the like is supplied as the freerunning frequency setting voltage, whereby it is possible to perform control such that the freerunning frequency responds to the input horizontal synchronizing frequency. However, when a control error is generated in the freerunning frequency or when the input synchronizing signal is a composite synchronizing signal including a vertical synchronizing signal, a vertical synchronizing component appears in the phase comparison output of the AFC circuit 9, resulting, for example, in the upper image portion being distorted.

The above-described first example of the conventional synchronous control device has the following problems regarding the synchronization stability with respect to noises, etc., accuracy in synchronizing frequency control, etc.:

(1) If noises, etc. are included in the input synchronizing signal, the output voltage of the FV conversion circuit fluctuates due to the noises, so that, in the horizontal synchronizing system, the display image is affected by a phenomenon such as image distortion. Further, when the input image signal is momentarily interrupted by the switching of he input image signal or the like, the output voltage of the FV conversion circuit greatly fluctuates, so that the synchronization immediately after the restoration of the input image signal to the normal condition is greatly disturbed, and the synchronization drawing time is delayed, with the result that the stability in synchronization deteriorates.

(2) Since it is difficult to prepare an oscillation circuit in which the voltage-frequency control characteristics are completely linear, the oscillation circuit has a predetermined non-linearity. As described above, the FV conversion output is faithfully proportional to the input frequency, so that the non-linear component of the oscillation circuit appears as a control error. Such a control error increases in proportion to the covered range of frequency, so that it is difficult to obtain a wide synchronizing frequency range.

In the second example of the conventional synchronous processing device, the problem at the time of reproduction of a standard television signal source is solved due to the above-described construction. However, in the case of the reproduction of a non-standard television signal source, there is a fear of malfunction occurring. That is, in a non-standard television signal source in conformity with a standard television signal such as a scan converter apparatus for converting the synchronizing frequency of a television signal to double the speed or a new image source such as a high-definition television, the possibility of these image sources including noises is the same as that in the case of the standard television signal source, so that when it is controlled by an automatic synchronization control circuit, there is a fear of the synchronization becoming unstable due to noises or the like. Thus, also in the case of a non-standard television signal source, there are many cases in which noises intrude even in the case of a non-standard television signal source, and it appears that such cases will increase more and more.

In the third example of the conventional synchronous processing device, the relationship of the absolute value of the oscillation frequency with respect to the control voltage of the oscillation circuit has variation in control sensitivity and non-linearity in control characteristics to a considerable degree. Thus, in the above-described third example of the prior art, the control sensitivity must be regulated for each circuit for the purpose of attaining coincidence in the relationship of the oscillation frequency with respect to given control voltage. Further, even when control sensitivity is regulated, it is impossible to perform high-accuracy control over the entire frequency range due to the presence of errors due to the non-linear components of the control characteristics, so that there are cases in which control errors of several % are generated. If the magnitude of these errors is within the AFC drawing range, there is no fear of synchronism being lost. However, from the viewpoint of performance such as image quality and stability in synchronization, the synchronization by AFC alone is not sufficient. Even in the usual television broadcasting, etc., the freerunning frequency is set to an accuracy of approximately 0.4%. Thus, an error in setting of as large as several % will result in the noise removal effect, for which the AFC circuit is intended, being deteriorated accordingly. Thus, the freerunning frequency must be adjusted as correctly as possible. However, it depends upon the characteristics of the analog circuit, so that it is difficult to achieve an improvement in control accuracy. In particular, when a wide frequency range is to be covered, this error cannot be accepted.

SUMMARY OF THE INVENTION

The present invention has been made in view of the above problems. It is accordingly an object of the present invention to provide a synchronous control device which secures a stable synchronization regardless of the kind of image source even in the worst condition in which the automatic synchronous control circuit cannot operate in the normal manner due to noises or the like and which abolishes the conventionally required regulation of control sensitivity and makes it possible to effect a highly accurate setting of freerunning frequency.

To achieve this object, the present invention provides a synchronous processing device for a multi-scan display device compatible with a plurality of horizontal synchronizing frequencies, the synchronous processing device comprising: a horizontal oscillation circuit; an AFC circuit which inputs a horizontal synchronizing signal and which controls the horizontal oscillation circuit so as to respond to the input horizontal synchronizing signal when this input horizontal synchronizing signal is substantially constant; frequency measuring means for measuring an input horizontal frequency; and control means for determining the true value of the horizontal synchronizing frequency on the basis of the frequency measured by the frequency measuring means and controlling the oscillation frequency of the horizontal oscillation circuit in accordance with changes in the determined true value.

In another aspect of the present invention, there is provided a synchronous processing device for a multi-scan display device compatible with a plurality of horizontal synchronizing frequencies, the synchronous processing device comprising: a horizontal oscillation circuit; an AFC circuit which inputs a horizontal synchronizing signal and which controls the horizontal oscillation circuit so as to respond to the input horizontal synchronizing signal when this input horizontal synchronizing signal is substantially constant; frequency detecting means for measuring the oscillation frequency of the horizontal oscillation circuit; control means for outputting a target value of the freerunning frequency of the horizontal oscillation circuit in accordance with changes in the frequency of the horizontal synchronizing signal; and oscillation frequency control means which, when the target value of the freerunning frequency is inputs, puts the AFC circuit into a non-operating state, and compares the detection result of the frequency detecting means with the target value of the freerunning frequency, controlling the freerunning frequency of the horizontal oscillation circuit in accordance with the comparison result.

In still another aspect of the present invention, there is provided a synchronous processing device for a multi-scan display device compatible with a plurality of horizontal synchronizing frequencies, the synchronous processing device comprising: a horizontal oscillation circuit; an AFC circuit which inputs a horizontal synchronizing signal and which controls the horizontal oscillation circuit so as to respond to the input horizontal synchronizing signal when this input horizontal synchronizing signal is substantially constant; first frequency detecting means for measuring an input horizontal frequency; second frequency detecting means for measuring the oscillation frequency of the horizontal oscillation circuit; and control means which determines a target value of the freerunning frequency of the horizontal oscillation circuit on the basis of the frequency detected by the first frequency detecting means and puts the AFC circuit into a non-operating state and which compares the detection result of the second frequency detecting means with the target value of the freerunning frequency and controls the freerunning frequency of the horizontal oscillation circuit in accordance with the result of this comparison.

BRIEF DESCRIPTION OF THE DRAWINGS

FIGS. 6A and 6B are diagrams showing a first example of a conventional synchronous processing device, of which

DESCRIPTION OF THE PREFERRED EMBODIMENTS

Four specific embodiments of the present invention will now be described with reference to the accompanying drawings.

First Embodiment

Figure 1:
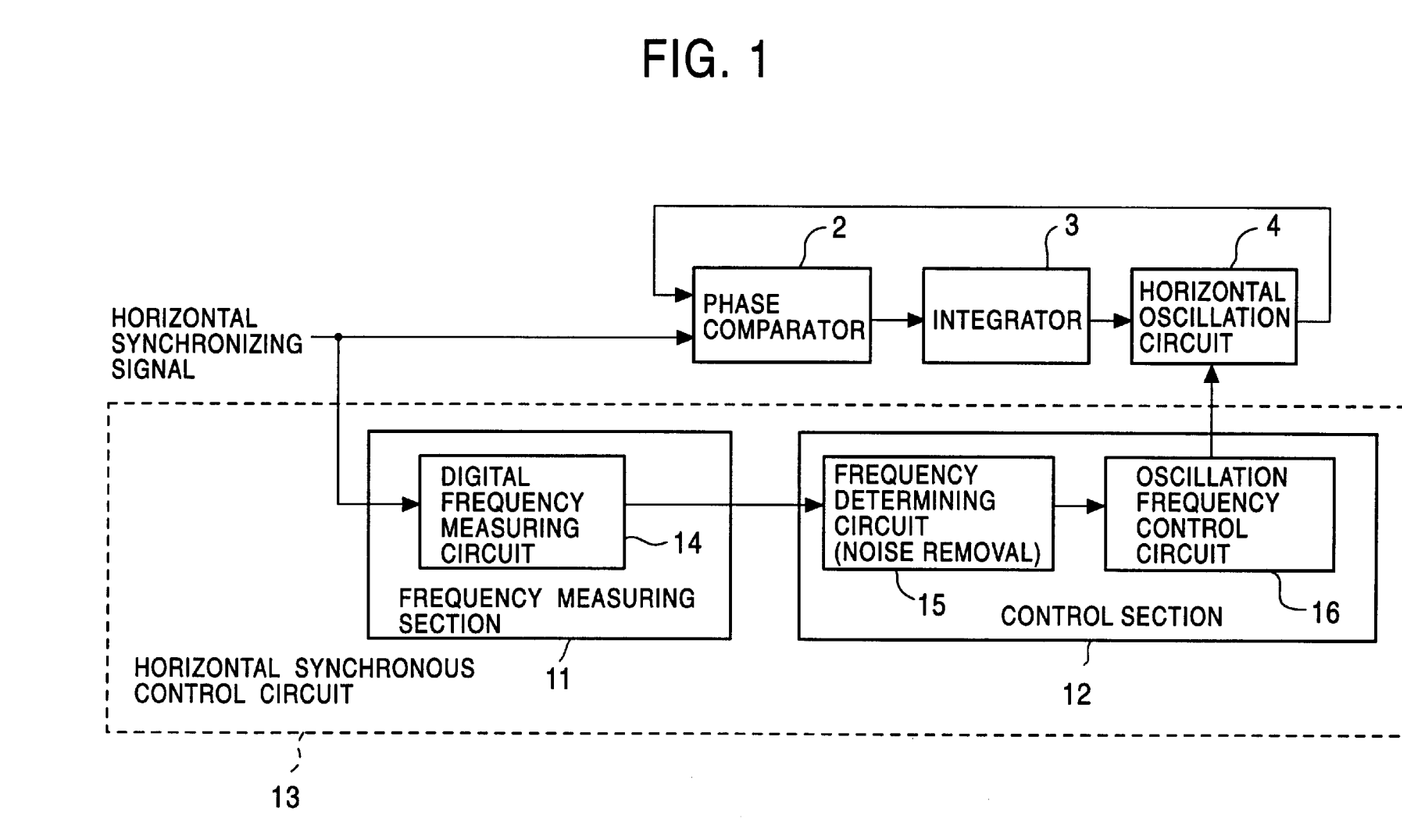
FIG. 1 is a block diagram showing a first embodiment of the synchronous processing device of the present invention.
Figure 2:
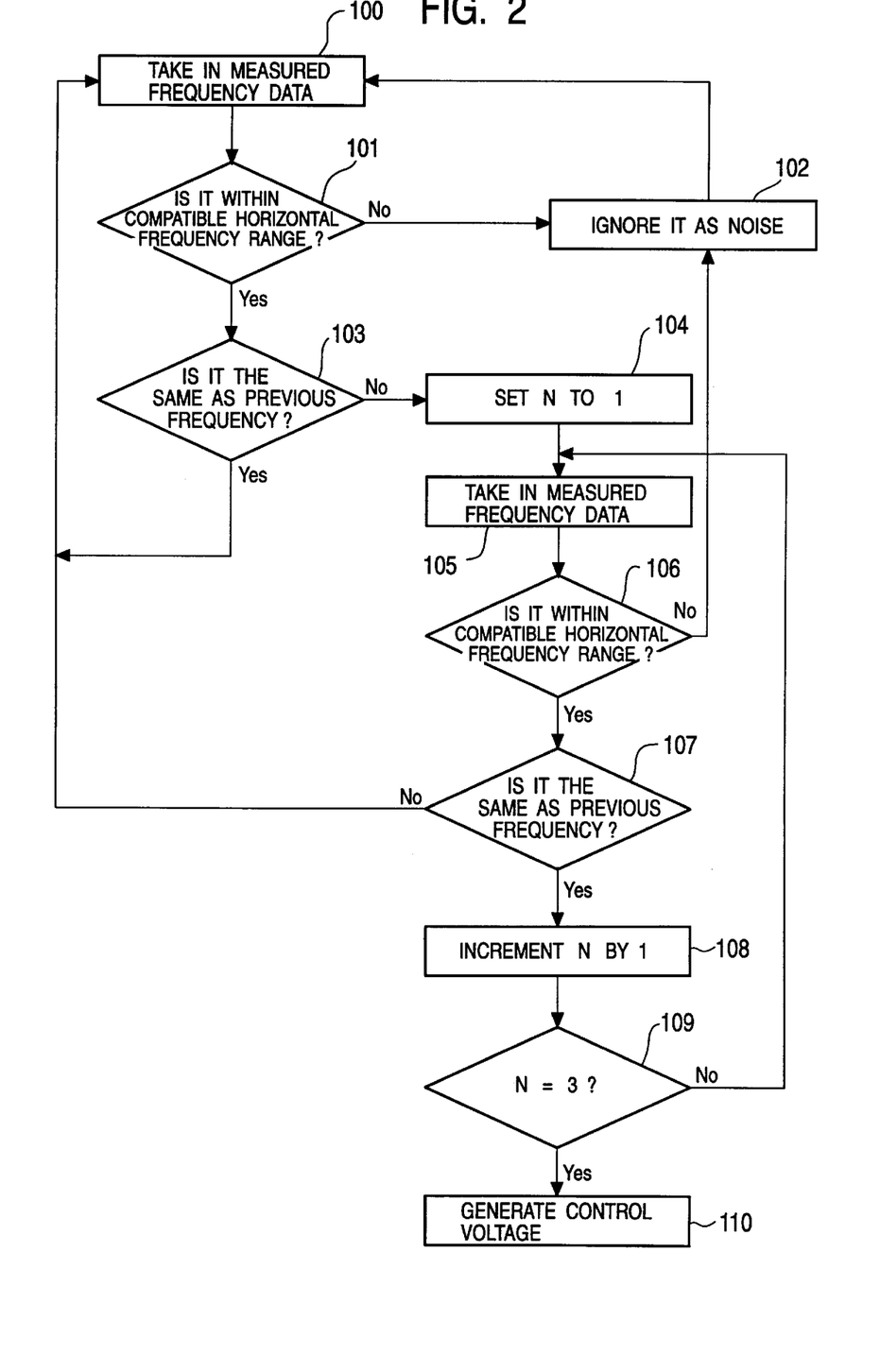
FIG. 2 is a flowchart showing the operation of the first embodiment.

First, the construction of the first embodiment of the synchronous processing device of the present invention will be described with reference to FIGS. 1 and 2. FIG. 1 is a block diagram showing the first embodiment of the synchronous processing device of the present invention.

Referring to FIG. 1, the essential part of the synchronous processing device of the present invention is composed of a phase comparator 2 to which a horizontal synchronizing signal is input, an integrator 3, a horizontal oscillation circuit 4, and a horizontal synchronous control circuit 13 composed of a frequency measuring section 11, a control section 12, etc. The frequency measuring section 11 comprises a digital frequency measuring circuit 14, and the control section 12 comprises a frequency determining circuit (noise removal) 15 and an oscillation frequency control circuit 16. Hardware logic may be applicable to the control section 12. In this embodiment, however, it is prepared by using a 1-chip microcomputer, and the operation of computing the measurement data and determining the true value of the input frequency and the control for causing the frequency of the horizontal oscillation circuit to respond to the determined frequency are realized through software by microcomputer programming.

Next, the operation of the synchronous processing device of the present invention, constructed as described above, will be described.

A horizontal synchronizing signal is input in parallel to the phase comparator 2 and the frequency measuring section 11, and the frequency measuring section 11 measures the input horizontal synchronizing frequency and transfers it to the control section 12 as digital data. The control section 12 determines the true value of the input synchronizing frequency by the frequency determining circuit (noise removal) 15 while monitoring the change in the frequency data obtained for each unit of time. This processing method will be described with reference to FIG. 2. In step 100, the control section 12 takes in the frequency data measured in the frequency measuring section 11. Then, in step 101, a judgment is made as to whether this frequency data taken in is within the compatible horizontal frequency range or not. That is, a judgment is made as to whether it is within a horizontal frequency range with which this multiple-scan display device is compatible, for example, 15~135 kHz, or not. When it is determined that it is outside the range, the data is ignored as noise data (step 102), and the procedure returns to step 100. When, in step 101, it is determined that it is within the range, a judgment is made as to whether it is the same as the previously measured frequency data or not (step 103). Here, the measured frequency data includes errors, so that, when the difference between it and the previously measured frequency data is, for example, 0.8% or less, it is determined that it is the same frequency. When, in step 103, it is determined that it is different from the previous frequency data, the parameter N is set to 1 in step 104. After this, from step 105 to step 107, the same procedures as those from step 100 to step 103, described above, are performed. When, in step 107, it is determined that it is the same frequency as the previous one, the parameter N is incremented by 1. Then, in step 109, a judgment is made as to whether the parameter N has become 3 or not. When the parameter has become 3, a control voltage corresponding to the newly measured frequency is output to the horizontal oscillation circuit 4. When the parameter N has not become 3 yet, the procedure returns to step 105. In this way, from step 104 to step 109, it is monitored whether frequency data different from the previously measured one is measured three times consecutively or not. When different frequency data has been measured three times consecutively, a control voltage is output to the horizontal oscillation circuit.

The oscillation frequency control circuit 16 performs control operation for adapting the oscillation frequency of the horizontal oscillation circuit 4 to the determined input frequency. In this process, it is also possible to perform a non-linear correction or the like in conformity with the control characteristics of the horizontal oscillation circuit 4. This processing may be performed, for example, by functionalizing the measured data of the control characteristics of the horizontal oscillation circuit 4 and incorporating the frequency data into the function for converting the frequency data to oscillation circuit control data. By this processing, it is possible to perform high-accuracy synchronous control over the entire range of the oscillation circuit, thereby making it possible to obtain a wide synchronizing frequency range. The present invention is not restricted to this embodiment. For example, a variety of logical operation means may be applicable to the operations of noise removal and oscillation frequency control realized through software in the above series of processes. These may be prepared by using hardware logic. Further, it is naturally also possible to apply the same control system to vertical synchronous control.

Second Embodiment

Figure 3:
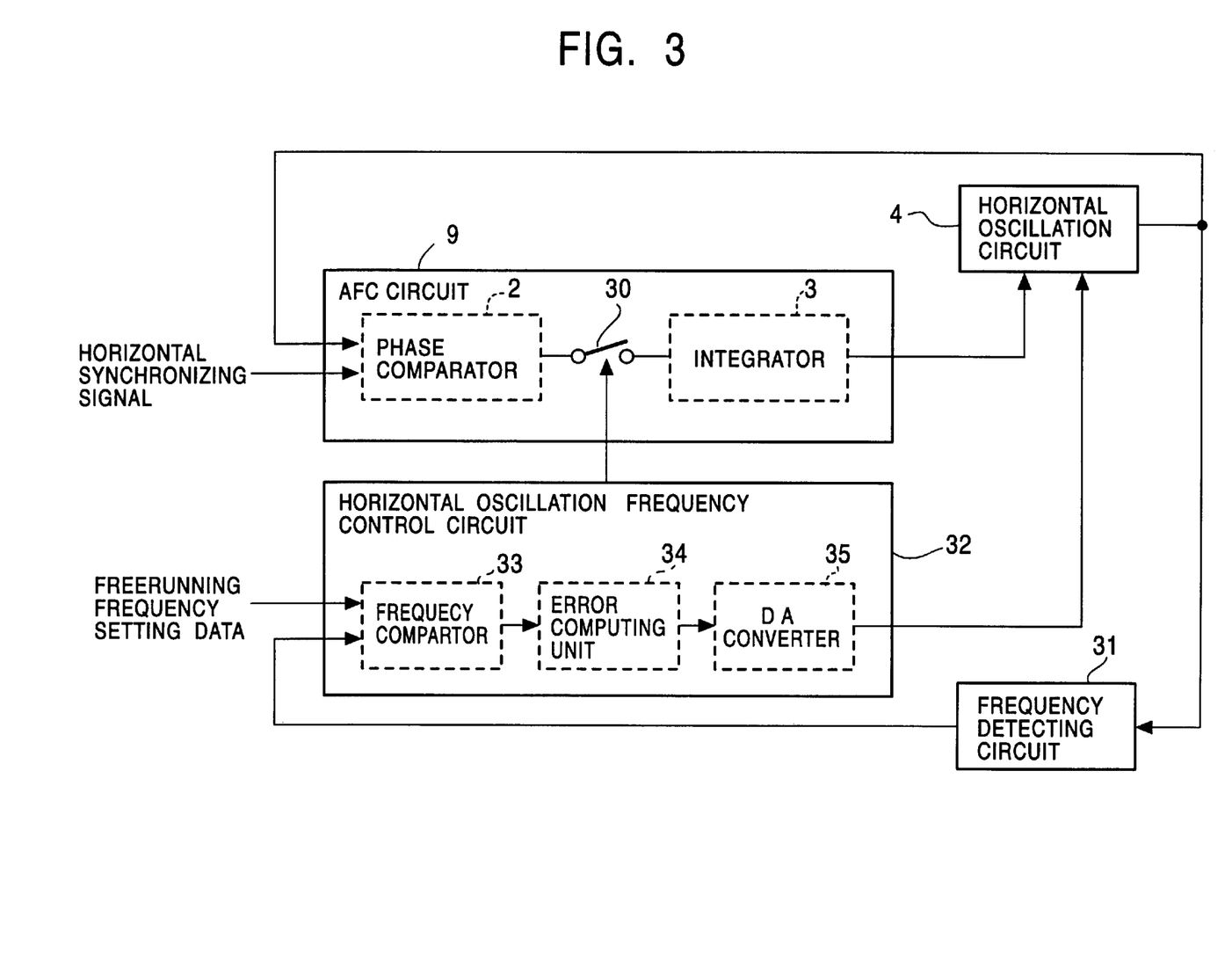
FIG. 3 is a block diagram showing a second embodiment of the synchronous processing device of the present invention.

In this embodiment, a negative feedback control loop is constructed from the oscillation circuit. Due to the negative feedback operation, there is no need to adjust to the control sensitivity of the horizontal oscillation circuit, and it is possible to set freerunning frequency with high accuracy over the entire range of the oscillation circuit. This will be described with reference to FIG. 3. FIG. 3 is a block diagram showing the third embodiment of the synchronous processing device of the present invention.

The essential part of the synchronous processing device of the present invention shown in FIG. 3 is composed of an AFC circuit 9 consisting of a phase comparator 2 to which a horizontal synchronous signal is input, an integrator 3, etc., a horizontal oscillation circuit 4, a frequency detecting circuit 31 for detecting the output frequency of the horizontal oscillation circuit 4 and performing digital measurement, and a horizontal oscillation frequency control circuit 32 for controlling the oscillation frequency of the horizontal oscillation circuit. Further, a switching device 30 is provided in the AFC circuit 9. The switching device 30 has a function by which it puts the AFC circuit into a non-operating state by a command from the horizontal frequency control circuit 32. The horizontal frequency control circuit 32 is composed of a frequency comparator 33, an error computing unit 34, a D/A converter 35, etc.

Next, the operation of the synchronous control device of the present invention, constructed as described above, will be described.

A horizontal synchronizing signal is input to the AFC circuit 9. When the horizontal synchronizing signal is stable, the operation of controlling the horizontal oscillation circuit 4 is performed by the AFC circuit 9. When a change in the setting of freerunning frequency has become necessary due to the switching of the input image signal, etc., a setting command for freerunning frequency setting data is supplied to the horizontal frequency control circuit 32 from a microcomputer (not shown). Here, the microcomputer detects a change in the frequency of the horizontal synchronizing signal by, for example, an image source switching operation. Then, as will be described below, the horizontal synchronizing frequency is stored beforehand in a memory or the like in correspondence with each image source. The microcomputer reads the horizontal synchronizing frequency corresponding to the switched image source, and outputs freerunning frequency setting data. In response to this, the horizontal oscillation frequency control circuit 32 controls the switching device 30 to put the AFC circuit 9 into a non-operating state and take in measurement data of oscillation frequency from the frequency measuring circuit 31. At this time, the AFC circuit 9 is in non-operating state, so that this data is freerunning frequency.

The frequency comparator 33 of the horizontal oscillation frequency control circuit 32 compares the freerunning frequency data measured by the frequency detecting circuit 31 with designated freerunning frequency setting data. The error computing unit 34 calculates by operation the change in the control voltage of the horizontal oscillation circuit 4 which minimizes the error from the error amount obtained by the frequency comparator 33. The D/A converter 35 performs digital-to-analog conversion of the computation result and supplies it to the horizontal oscillation circuit 4, varying the oscillation frequency of the horizontal oscillation circuit 4. The horizontal oscillation frequency control circuit 32 repeats such a series of processes to thereby build a negative feedback control loop. Due to the negative feedback control, the freerunning frequency is made to coincide with the set target value by several loop processings, so that, when the coincidence is attained, the AFC circuit 9 comes out of the loop and is restored to the operating state, with which the freerunning frequency setting processing is completed. Due to this processing, any variation in the control sensitivity of the horizontal oscillation circuit 4, etc. is absorbed by the negative feedback loop, so that there is no need to perform control sensitivity adjustment, which has conventionally been necessary.

In this way, according to this embodiment, due to the high-accuracy digital frequency detection and negative feedback operation, there is no need to perform control sensitivity adjustment on the horizontal oscillation circuit 4, which has conventionally been necessary. At the same time, high-accuracy freerunning frequency setting is possible over the entire range of the oscillation circuit. The present invention is not restricted to this embodiment. For example, the AFC circuit may also be put into a non-operating state by interrupting the synchronizing signal. Further, the frequency measurement of the oscillation circuit may be effected through the measurement of the drive circuit on the output side of the oscillation circuit. Further, in the case, for example, of a built-in scan converter function, the frequency measurement may be effected in terms of integral multiples. In this way, various modifications are possible.

Third Embodiment

Figure 4:
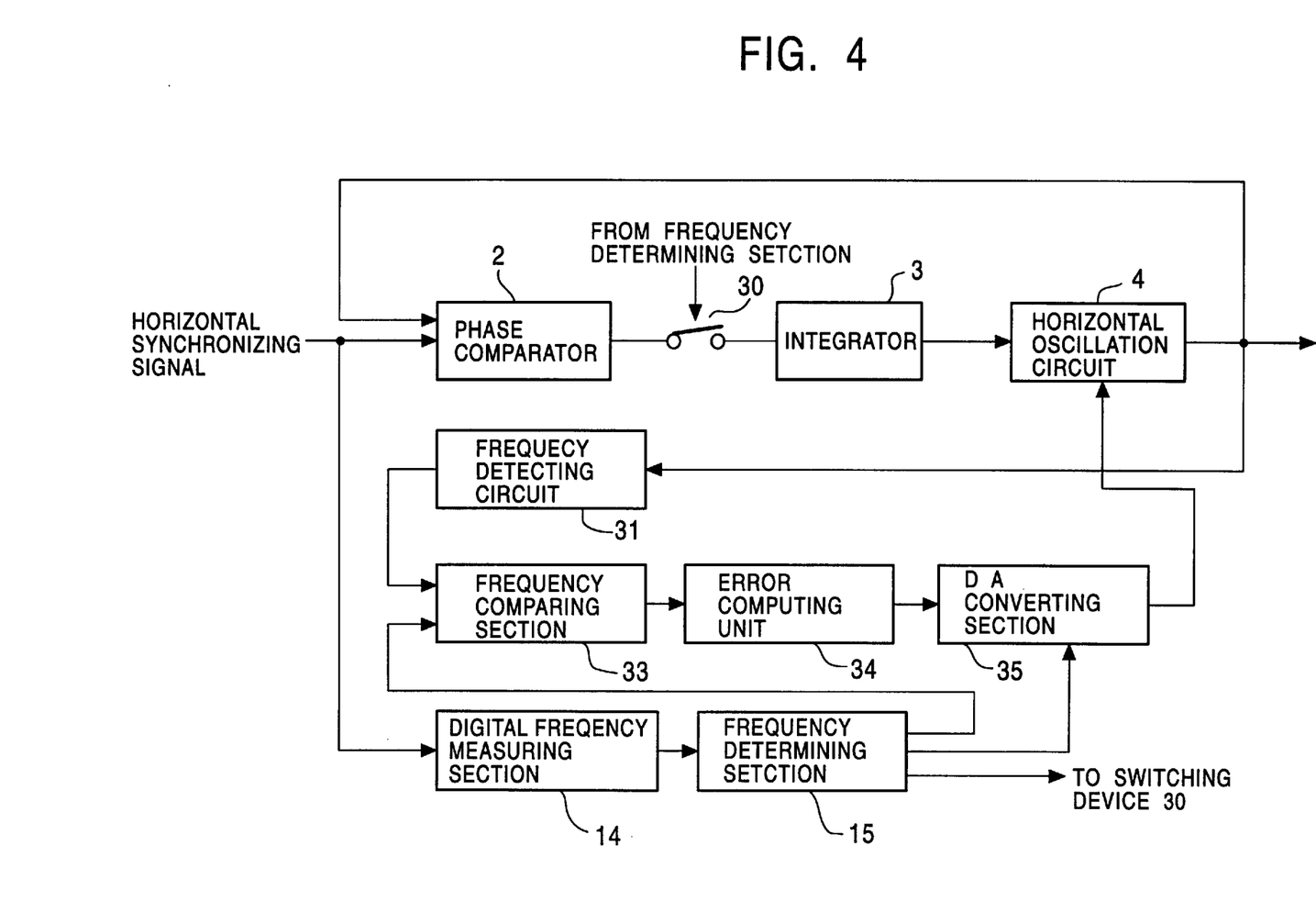
FIG. 4 is a block diagram showing a third embodiment of the synchronous processing device of the present invention.

It is also possible to combine the first embodiment, described with reference to FIG. 1, with the second embodiment, described with reference to FIG. 3. An example of this combination will be described with reference to FIG. 4. The essential part of the synchronous processing device shown in FIG. 4 is composed of a phase comparator 2 to which a horizontal synchronizing signal is input, a switching device 30, an integrator 3, a horizontal oscillation circuit 4, a digital frequency measuring section 14, a frequency determining section (noise removal) 15, a frequency detecting circuit 31, a frequency comparator 33, an error computing unit 34, a D/A converter 35, etc.

Next, the operation of the synchronous processing device shown in FIG. 4 will be described. A horizontal synchronizing signal is input in parallel to the phase comparator 2 and the digital frequency measuring section 14. At the same time, the digital frequency measuring section 14 measures the input horizontal synchronizing frequency and transfers it to the frequency determining section 15 as digital data. As described with reference to FIGS. 1 and 2, the frequency determining section 15 monitors the transition of frequency data obtained per unit time, and determines the true value of the input synchronizing frequency.

When the frequency determining section 15 detects that the frequency of the horizontal synchronizing signal has changed due to the switching of image source, etc., the control voltage data of the horizontal oscillation circuit 4 is first transferred to the DA converting section 35. Then, control voltage is supplied from the DA converting section 35 to the horizontal oscillation circuit 4, whereby a signal having a frequency considerably close to that of the input horizontal synchronizing signal is output from the horizontal oscillation circuit 4.

Next, the frequency determining section 15 supplies the freerunning frequency data of the horizontal oscillation circuit 4 to the frequency comparing section 33. Further, the frequency determining section 15 controls the switching device 30 so as to put the AFC circuit composed of the phase comparator 2 and the integrator 3 into a non-operating state and, at the same time, takes in measurement data of oscillation frequency from the frequency measuring circuit 31. At this time, the AFC circuit is in a non-operating state, so that this data consists of freerunning frequency.

The frequency comparing section 33 compares the freerunning frequency data measured by the frequency detecting circuit 31 with designated freerunning frequency setting data. The error computing unit 34 calculates by operation the requisite change in the control voltage of the horizontal oscillation circuit 4 for minimizing the error from the error amount obtained by the frequency comparator 33. The D/A comparator 35 performs digital-to-analog conversion of the computation result and supplies it to the horizontal oscillation circuit 4 to vary the oscillation frequency of the horizontal oscillation circuit 4. The horizontal oscillation frequency control circuit 32 repeats this series of operations to thereby build a negative feedback control loop. Due to the negative feedback control, the freerunning frequency is made to coincide with the set target value by several times of loop processing, so that, when the coincidence is attained, the switching device 30 is controlled to the closed state, whereby the AFC circuit comes out of the loop and is restored to the operating state, with which the freerunning frequency setting operation is completed. Due to this processing, any variation in the control sensitivity of the horizontal oscillation circuit 4, etc. is absorbed by the negative feedback loop, so that there is no need to perform control sensitivity regulation, which has conventionally been necessary. In the case of this embodiment also, the frequency determining section 15, the frequency comparator 33, the error computing unit 34 are formed by 1-chip microcomputer and can be realized through software by microcomputer programming.

Fourth Embodiment

Figure 5:
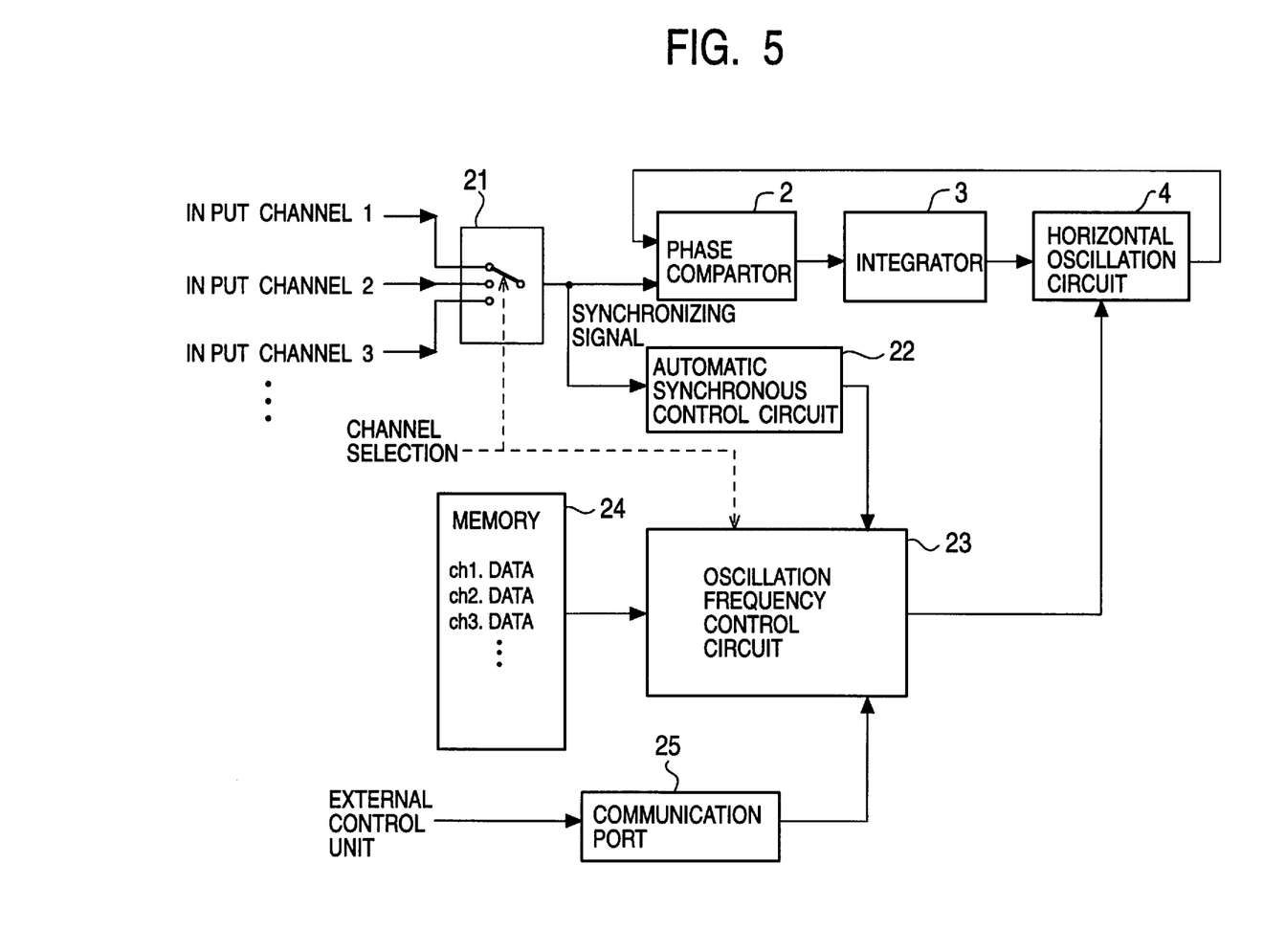
FIG. 5 is a block diagram showing a fourth embodiment of the synchronous processing device of the present invention.

In this embodiment, synchronizing frequency control data for each of input channels 1, 2 and 3 is supplied from a memory or a communication port so that stable synchronizing frequency data can be obtained. This will be described with reference to FIG. 5. FIG. 5 is a block diagram showing the fourth embodiment of the synchronous processing device of the present invention.

The essential part of the synchronous processing device of the present invention shown in FIG. 5 is composed of a phase comparator 2 to which a horizontal synchronizing signal is input, an integrator 3, a horizontal oscillation circuit 4, a switching device 21 for switching between input channels 1, 2 and 3, an automatic synchronous control circuit 22, an oscillation frequency control circuit 23 which controls the horizontal oscillation circuit 4 by the automatic synchronous control circuit 22 and which controls it in accordance with control data supplied from a memory described below or a communication port as a communication means, a memory 24 serving as a storage means for storing control data corresponding to the input channels 1, 2, and 3, a communication port 25 for supplying a synchronizing frequency from the outside of this multi-scan display device as digital data, etc.

The operation of the synchronous control device of the present invention, constructed as described above, will be described.

The input channels 1, 2, 3 . . . are input to the switching device 21 and, at the same time, a synchronizing signal is input to the phase comparator 2 and the automatic synchronous control circuit 22. In the case of an image source free from input signal noises, the horizontal oscillation circuit 4 is controlled as described above by the automatic synchronous control circuit 22. A predetermined input channel is selected through channel selection. In a condition in which the input signal of the input channel cannot operate the automatic synchronous control circuit 22 in a stable manner due to noises, the synchronizing frequency is determined by digital data corresponding to the synchronizing frequency of the input signal for each input channel stored previously to control the horizontal oscillation circuit 4.

This digital data is stored for each input channel. When it is so arranged that the digital data of the corresponding memory 24 is automatically selected in synchronism with the channel switching, the actual feeling of use is the same as that in automatic synchronous control. When the input channel is restricted to a particular image source, the above-mentioned memory 24 may be a ROM with fixed data. However, by using EEPROM which allows rewriting and storage, the device can be made flexibly compatible with every type of image source. Further, when it is so arranged that selection between automatic control for each channel and use of the digital data stored in the memory 24 can be previously set, selective use is possible as needed.

Further, in a synchronous processing device according to the present invention, a plurality of display devices are used to build the system, and a communication port 25 for supplying a synchronizing frequency from an external device as digital data is provided in order that use in an application for concentric control of the system by a control device such as a computer may be facilitated. This communication port 25 makes it possible to securely and freely control the synchronizing frequencies of a plurality of display devices. The present invention is not restricted to this embodiment. For example, it is also possible for the memory for storing the frequency data to be composed of a plurality of memories each independent for each input channel. Regarding the data stored in the memory, a plurality of items of data may be retained with respect to one channel, and the data stored may be data representing period. Further, it is naturally also possible to apply the above-mentioned control system to vertical synchronous control.

The present invention is not restricted to the above embodiments and allows a variety of modifications. For example, while the above embodiments have been described as applied to a display device, it is naturally also applicable to other AV apparatuses responsive to a plurality of input signals, for example, video apparatuses, recording-mediumintegrated-type monitor devices, etc. That is, by forming the synchronous processing device of the present invention as an integrated circuit and mounting it on these AV apparatuses or by providing built-in software through microcomputer programming, it is possible to securely perform synchronous processing on these AV apparatuses. Further, it goes without saying that the present invention can be developed into various forms without being restricted to any one of the above-described embodiments.

As described above, in the synchronous processing device of the present invention, an input synchronizing frequency is measured as digital data by frequency measuring means and subjected to digital computing operation by control means, whereby the following advantages can be obtained:

(1) Even when noises are included in the input synchronizing signal, sophisticated noise removal operation is possible by frequency data computing processing, so that it is possible to realize a stability in synchronization with respect to noises which is practically equal to that of a display device in which the synchronizing frequency is fixed.

(2) The input synchronizing frequency data is highly accurate and it is possible to easily perform non-linear correction of the voltage/frequency control characteristics of the horizontal oscillator, etc., so that highly accurate synchronous control is possible over the entire range of the oscillation circuit, thereby making it possible to realize a display device covering a wide synchronizing frequency range.

Further, by the frequency detection by the frequency detecting means and the negative feedback control operation by the negative feedback loop, the following advantages are obtained:

(1) There is no need to perform control sensitivity adjustment, which has conventionally been necessary.

(2) The setting of freerunning frequency is possible with high accuracy over the entire range of the oscillation circuit, and the AFC operates in an optimum condition, so that it is possible to obtain a stable synchronization which is noise-resistant.

Further, since storage means capable of storing the synchronizing frequency of the input signal as digital data and communication means capable of setting the synchronizing frequency from outside the device are provided, the following advantages are obtained:

(1) Even in the worst condition in which noises are included in the input synchronizing signal to make it impossible for the automatic synchronous control circuit to operate in the normal manner, stable synchronization can be achieved.

(2) Unlike the conventional methods, no control system depending upon the kind of image source is adopted, so that it is possible for the device to be flexibly compatible with all kinds of image sources.

(3) In the case of an image source with a fixed synchronizing frequency, in which no automatic synchronous control is needed, storage means is used, whereby a control which is quicker and securer than automatic synchronous control is possible.

What is claimed is:

1. A synchronous processing device for a multi-scan display device compatible with a plurality of horizontal synchronizing frequencies, said synchronous processing device comprising:

a horizontal oscillation circuit;

an AFC circuit which receives an input horizontal synchronizing signal and which controls said horizontal oscillation circuit so as to respond to the input horizontal synchronizing signal when said input horizontal synchronizing signal is substantially constant;

frequency measuring means for measuring an input horizontal frequency; and control means including:

means for determining whether the frequency measured by the frequency measuring means is within a range with which said multiple-scan display device is compatible and processing said measured frequency as noise when the measured frequency is outside the frequency range; and means for determining the true value of the horizontal synchronizing frequency on the basis of the frequency measured by said frequency measuring means, said control means controls the oscillation frequency of said horizontal oscillation circuit in accordance with changes in the determined true value when the determining means determines that the measured frequency is within the predetermined range and said control means does not control the oscillation frequency of said horizontal oscillation circuit in accordance with changes in the determined true value when the determining means determines that the measured frequency is outside the predetermined range.

2. A synchronous processing device according to claim 1, wherein said AFC circuit comprises:

a phase comparison circuit which inputs said horizontal synchronizing signal and an output from said horizontal oscillation circuit; and an integration circuit which inputs an output from said phase comparison circuit and supplies a control signal to said horizontal oscillation circuit.

3. A synchronous processing device according to claim 2, wherein said control means consists of a microcomputer.

4. A synchronous processing device according to claim 3, wherein said microcomputer determines that the frequency of the horizontal synchronizing signal has changed when the frequency data supplied from said frequency measuring means differs from the frequency data that has been previously supplied thereto and when a same frequency data is supplied a plurality of times in succession, and controls the oscillation frequency of said horizontal oscillation circuit.

5. A synchronous processing device for a multi-scan display device compatible with a plurality of horizontal synchronizing frequencies, said synchronous processing device comprising:

a horizontal oscillation circuit;

an AFC circuit which receives an input horizontal synchronizing signal and which controls said horizontal oscillation circuit so as to respond to the input horizontal synchronizing signal when this input horizontal synchronizing signal is substantially constant;

frequency detecting means for measuring the oscillation frequency of said horizontal oscillation circuit;

control means for outputting a target value of the freerunning frequency of said horizontal oscillation circuit in accordance with changes in the frequency of the horizontal synchronizing signal; and oscillation frequency control means which, when the target value of the frequency is input, puts said AFC circuit into a non-operating state, and compares the detection result of said frequency detecting means and the target value of the freerunning frequency so as to control the freerunning frequency of said horizontal oscillation circuit in accordance with the comparison result, and puts the AFC into an operating state when the detection result of said frequency detecting means and the target value of the freerunning frequency are similar.

6. A synchronous processing device according to claim 5, wherein said control means comprises storage means for storing horizontal synchronizing frequency data with respect to each of a plurality of image sources that can be input to said multi-scan display device, and, in response to the switching of said image sources, reads horizontal synchronizing frequency data corresponding to the image source switched from said storage means, outputting the target value of the freerunning frequency of said horizontal oscillation circuit.

7. A synchronous processing device for a multi-scan display device compatible with a plurality of horizontal synchronizing frequencies, said synchronous processing device comprising:

a horizontal oscillation circuit;

an AFC circuit which receives an input horizontal synchronizing signal and which controls said horizontal oscillation circuit so as to respond to the input horizontal synchronizing signal when this input horizontal synchronizing signal is substantially constant;

first frequency means for measuring an input horizontal frequency;

second frequency detecting means for measuring the oscillation frequency of said horizontal oscillation circuit; and control means which determines a target value of the freerunning frequency of said horizontal oscillation circuit on the basis of the frequency detected by the first frequency detecting means and puts the AFC circuit into a non-operating state and which compares the detection result of the second frequency detecting means with the target value of the freerunning frequency so as to control the freerunning frequency of said horizontal oscillation circuit in accordance with the result of this comparison, and puts the AFC into an operating state when the detection result of said frequency detecting means and the target value of the freerunning frequency are similar.

8. A synchronous processing device according to claim 7, wherein said control means consists of a microcomputer.

9. A synchronous processing device according to claim 8, wherein said microcomputer makes a judgment as to whether the frequency data detected by the first frequency detecting means is within a range with which said multiple-scan display device is compatible or not and, when the detected frequency data is outside the frequency range, processes it as noise.

10. A synchronous processing device according to claim 8, wherein said microcomputer determines that the frequency of the horizontal synchronizing signal has changed when the frequency data supplied to said microcomputer from the first frequency detecting means differs from the frequency data that has been previously supplied thereto and when a same frequency data is supplied a plurality of times in succession, and controls the oscillation frequency of said horizontal oscillation circuit.

* * * * *